(12) United States Patent
Tan et al.

(10) Patent No.: US 8,455,771 B2
(45) Date of Patent: Jun. 4, 2013

(54) ELECTROMAGNETIC SHIELDING DEVICE

(75) Inventors: Zheng-Ping Tan, Shenzhen (CN); Kuan-Hung Chen, Shinidain (TW); Yao Wang, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 284 days.

(21) Appl. No.: 12/968,427

(22) Filed: Dec. 15, 2010

(65) Prior Publication Data

US 2012/0031661 A1    Feb. 9, 2012

(30) Foreign Application Priority Data

Aug. 4, 2010    (CN) .......................... 2010 1 0245078

(51) Int. Cl.
*H05K 9/00* (2006.01)
*H01R 4/00* (2006.01)
*H02B 1/44* (2006.01)

(52) U.S. Cl.
USPC .......................... 174/375; 174/384; 174/382

(58) Field of Classification Search
USPC .................. 174/377, 382, 384, 375; 361/816
See application file for complete search history.

(56) References Cited

U.S. PATENT DOCUMENTS

| | | | | |
|---|---|---|---|---|
| 5,614,694 A | * | 3/1997 | Gorenz et al. | 174/375 |
| 5,737,194 A | * | 4/1998 | Hopkins et al. | 361/800 |
| 5,796,578 A | * | 8/1998 | Jones | 361/679.55 |
| 6,469,904 B1 | * | 10/2002 | Vigeant et al. | 361/752 |
| 6,897,371 B1 | * | 5/2005 | Kurz et al. | 174/382 |
| 7,358,447 B2 | * | 4/2008 | Gabower | 174/378 |

* cited by examiner

*Primary Examiner* — Hung Ngo
(74) *Attorney, Agent, or Firm* — Altis Law Group, Inc.

(57) ABSTRACT

A shielding device includes a frame, a shielding enclosure and a shaft. The frame includes sidewalls and at least one hinged portion. The shielding enclosure includes a cover and flanges extending therefrom for engagement with the sidewalls of the frame. A barrel portion is formed on the shielding enclosure and is aligned with the hinged portion. The shaft extends through the hinged portion and the barrel portion for rotatably connecting the shielding enclosure to the frame.

6 Claims, 5 Drawing Sheets

ELECTROMAGNETIC SHIELDING DEVICE

BACKGROUND

1. Technical Field

The present disclosure relates to a shielding device for a printed circuit board, and particularly to a shielding device having a shielding enclosure that may be easily opened.

2. Description of Related Art

Electronic components of a printed circuit board radiate electromagnetic waves which generate electronic noise or unwanted signals. Accordingly, it is highly desirable to provide shielding for electronic components of printed circuit boards, which are susceptible to electromagnetic radiation. Since the electric telecommunication equipment must withstand interference of electromagnetic radiation, a shielding device can be used to decrease radiation emission.

The shielding device usually includes an enclosure and a frame. The enclosure is tightly latched to the frame. To access electronic components inside the enclosure, the enclosure of the shielding device needs to be removed. However, it can be difficult to remove the enclosure from the frame.

Therefore, there is room for improvement within the art.

BRIEF DESCRIPTION OF THE DRAWINGS

Many aspects of the present shielding device can be better understood with reference to the following drawings. The components in the drawings are not necessarily drawn to scale, the emphasis instead being placed upon clearly illustrating the principles of the present hinge assembly. Moreover, in the drawings, like reference numerals designate corresponding parts throughout the several views.

DETAILED DESCRIPTION

Figure 1:
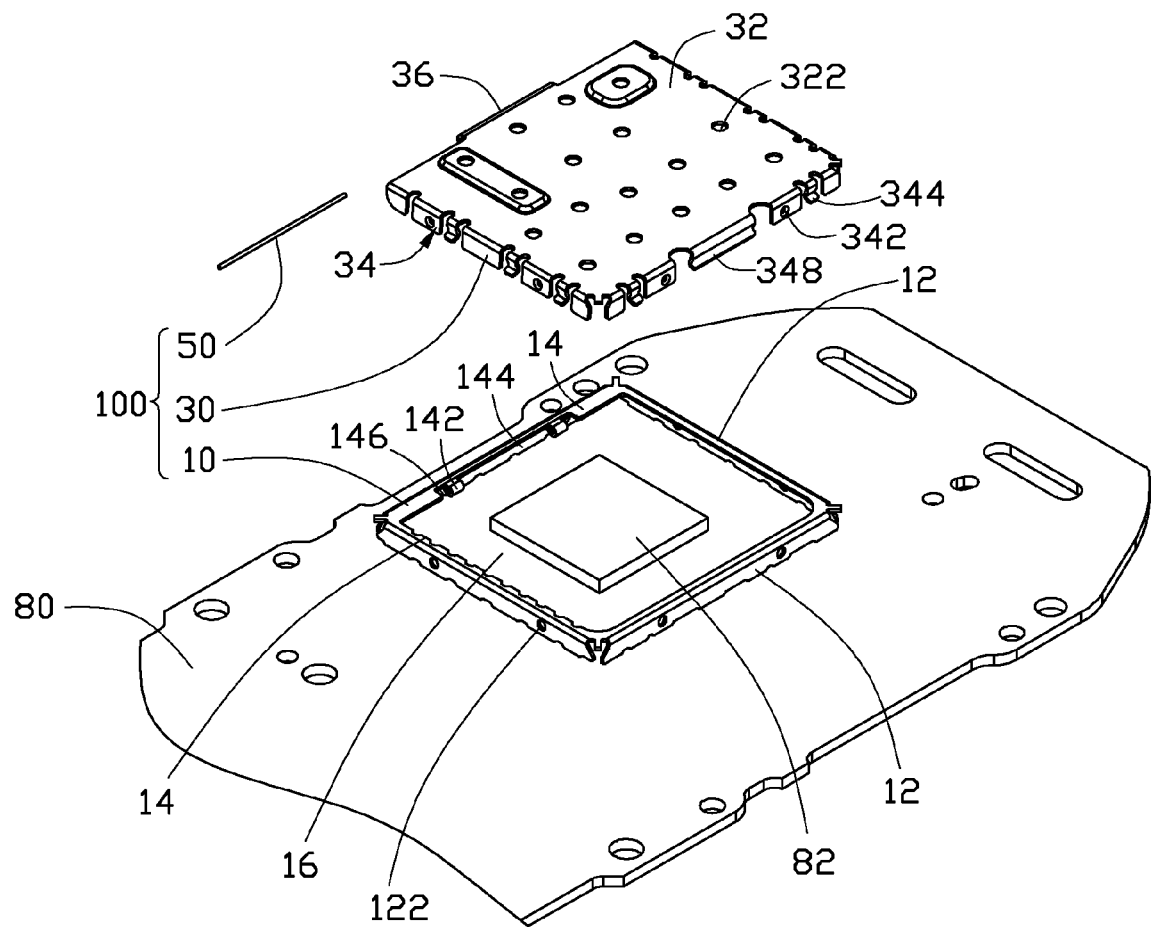
FIG. 1 is an exploded, isometric view of a shielding device.
Figure 2:
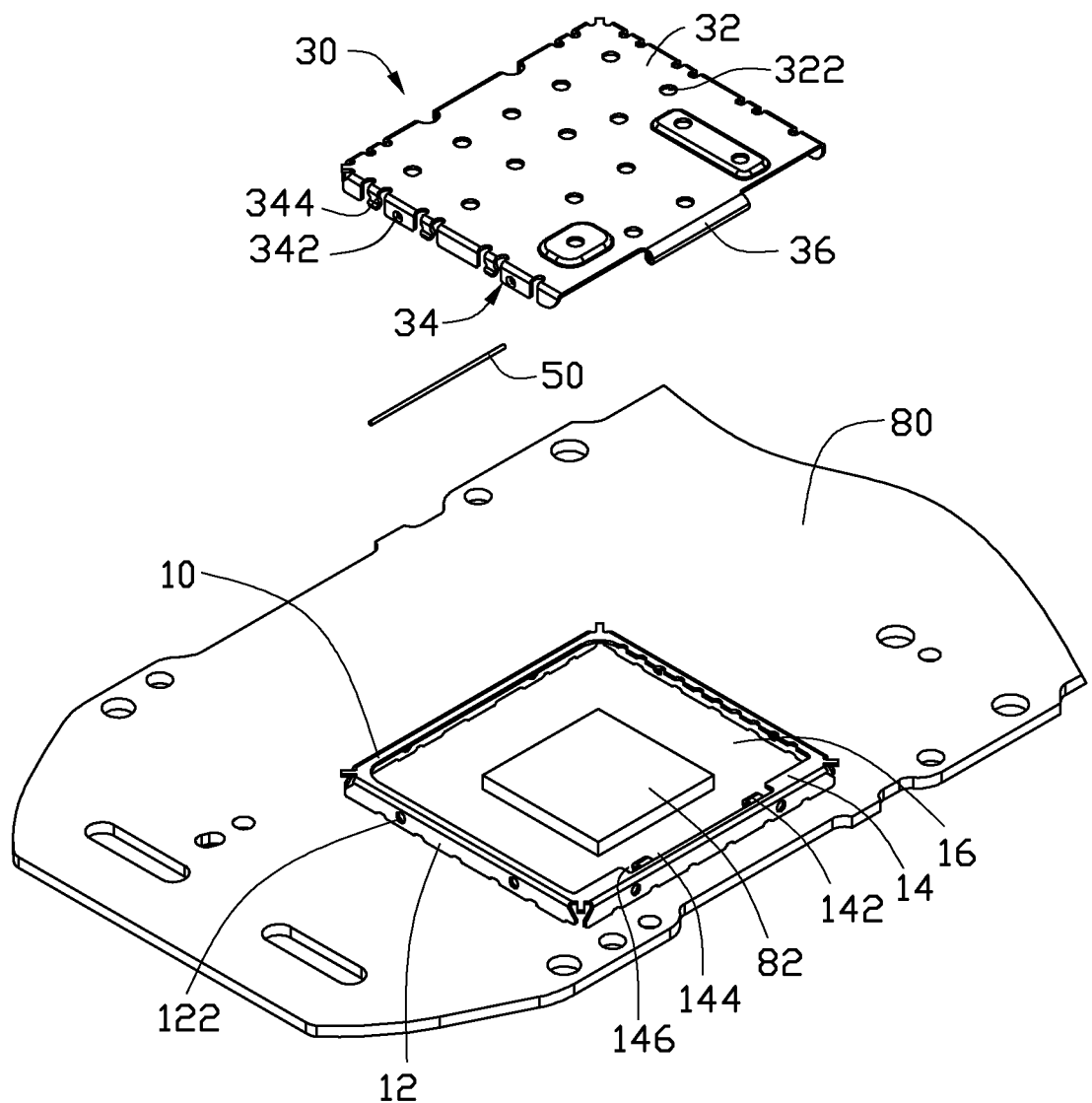
FIG. 2 is similar to FIG. 1, but shown from another aspect.

Referring to FIGS. 1 and 2, the shielding device 100, in one illustrated first embodiment, is positioned on a printed circuit board 80. Understandably, the shielding device 100 is used for shielding at least one electronic component 82 on the printed circuit board 80. The shielding device 100 includes a frame 10, a shielding enclosure 30 and a shaft 50. The shielding enclosure 30 is hinged to the frame 10 by the shaft 50 so that the shielding enclosure 30 can be rotatably opened to access any electrical components contained within the shielding enclosure.

The frame 10 includes a top wall 14 and a plurality of sidewalls 12 extending downwardly from outer edges of the top wall 14. The frame 10 shown herein for illustrative purpose is polygonal, however, any other shapes may also be used. The top wall 14 of the frame 10 defines a central opening 16 for receiving electrical components disposed on the printed circuit board 80. The sidewalls 12 are configured for being soldered to a conductive area of the printed circuit board 80 so that the sidewalls 12 of the frame 10 surround electronic components on a particular area of the printed circuit board 80. Each sidewall 12 of the frame 10 defines at least one hole 122. Two opposite hinged portions 142 are formed on fringes of the top wall 14. The top wall 14, the sidewalls 12 and the hinged portions 142 can be formed from a single sheet. The hinged portion 142 can be bent to form a coiled shape. In this exemplary embodiment, one of the fringes of the top wall 14 defines a notch 144 with a first edge and two opposite second edges connected to each other. The hinged portions 142 are formed on the first edge. A gap 146 is defined between each hinged portion 142 and adjacent second edge 1442 of the top wall 14.

The shielding enclosure 30 includes a cover 32, a plurality of flanges 34, and a barrel portion 36. An upper surface of the cover 32 is generally parallel to the top wall 14 of the frame 10 when the shielding enclosure 30 is positioned over the frame 10. The cover 32 defines a plurality of holes 322. The flanges 34 extend downwardly from three edges of the cover 32, at an angle of approximately 90 degrees, allowing the flange 34 to cover the frame 10. At least one flange 34 is extruded to form at least one protrusion 342 extending toward inside for being received in the hole 122. At least one elastic tab 344 is spaced apart from two sides of the flange 34. The barrel portion 36 is formed on the edge of the cover 32 without the flanges 34 by bending and/or stretching into a coiled shape. An operating portion 348 is formed on an opposite side of the barrel portion 36. The cover 32, the flanges 34, the barrel portion 36 and the operating portion 348 can be formed from a single sheet.

The frame 10 and the shielding enclosure 30 are preferably made from a metallic material, such as tin plated steel. However, other metal materials such as tin plated phosphor bronze, beryllium copper and other alloys of copper may also be used depending upon the required degree of shielding. In particular, however, it is desirable that the metal materials used for manufacturing the shielding enclosure 30 be capable of being readily soldered or welded with low resistance electrical conductivity. However, if the primary purpose of the shield is to reduce magnetic field interference, it is generally preferable to use a steel or other alloy that has a relatively high permeability at low frequencies. To provide electrical conductivity on materials with relatively high resistance, the material may be plated with a low resistance metal, such as tin. If the principal concern of the shield is to reduce electrical field interference, then it is generally preferable to use a copper alloy as will be readily apparent to one skilled in the art of electromagnetic shielding.

The shielding device 100 of the present disclosure may be easily and inexpensively manufactured. At first, the shielding enclosure 30 including the cover 32 is stamped or punched from sheet metal. At the same time, the sheet metal is also directly cut into the flanges 34 and a predetermined strip. Afterwards, the sides of the shielding enclosure 30 are bent to form the flanges 34, the predetermined strip is bent into a coil to form the barrel portion 36, and thereby the final product of the shielding enclosure 30 is obtained. The frame 10 is likewise easily formed using standard sheet metal or sheet foil processing techniques. The formed way of the hinged portions 142 is similar to the barrel portion 36.

The shaft 50 extends through the barrel portion 36 and the hinged portions 142 so that the shielding enclosure 30 is rotatably connected to the frame 10. In this exemplary embodiment, two distal ends of the shaft 50 are received in the gaps 146. This structure may effectively prevent the shaft 50 from separating from the enclosure 30 and the frame 10.

Figure 3:
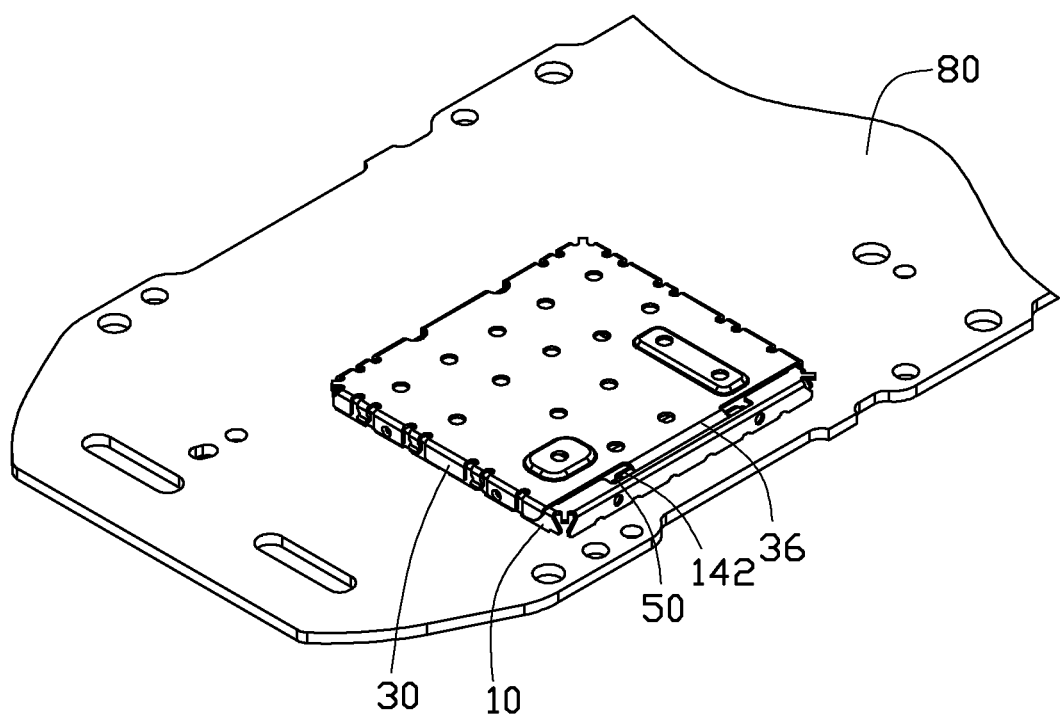
FIG. 3 is an assembled view of the shielding device shown in FIG. 1.
Figure 4:
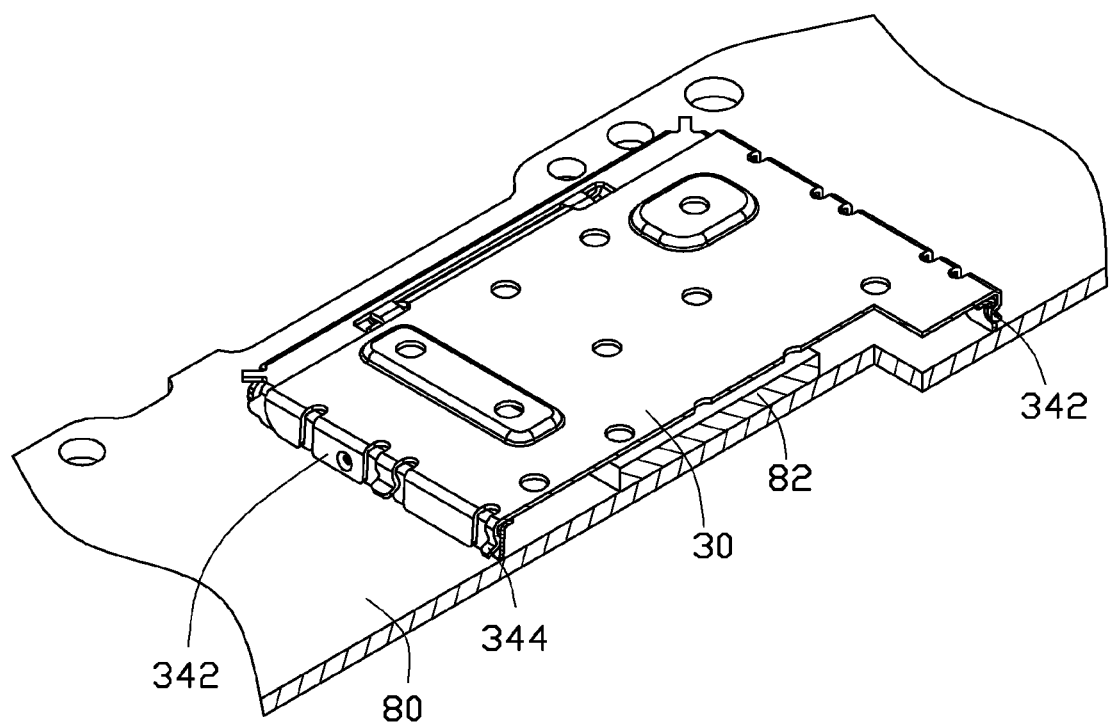
FIG. 4 is a cut-away view of FIG. 3.
Figure 5:
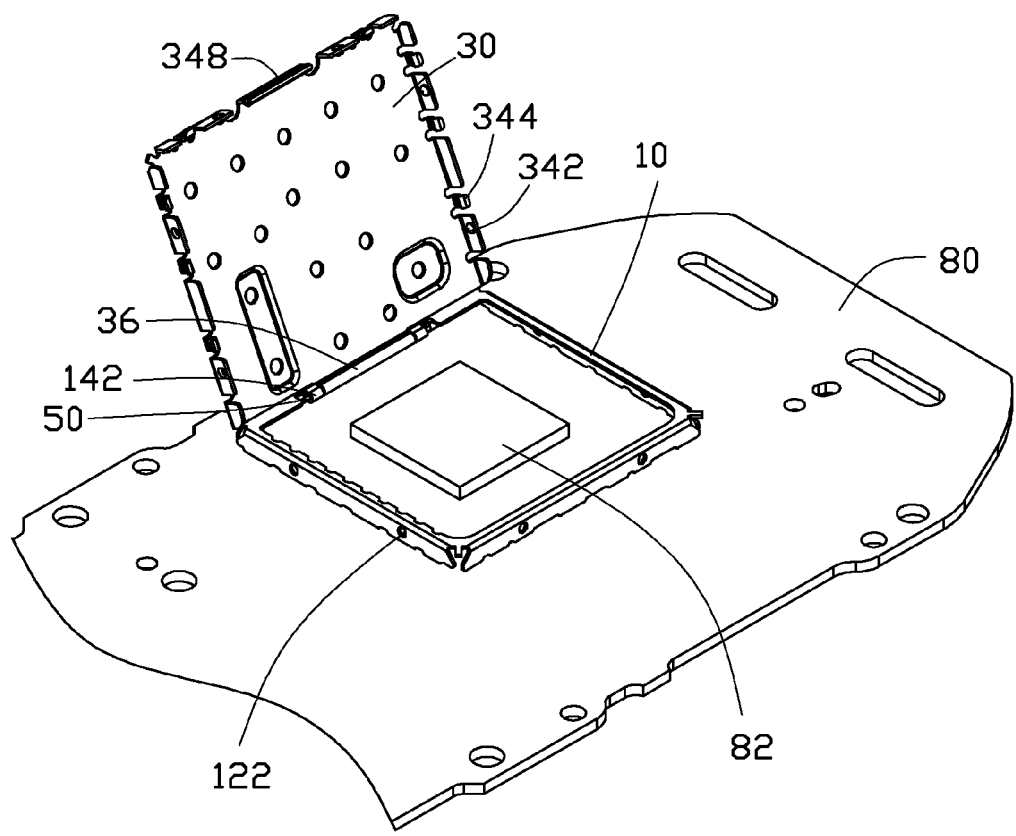
FIG. 5 is similar to FIG. 3 but from a different angle and showing the enclosure in an opened state.

In assembly, referring to FIGS. 3 to 5, the frame 10 is disposed over one or more electric or electronic components on the printed circuit board 80 to reduce electromagnetic interference from or to adjacent components, and is mounted on the printed circuit board 80 by soldering or the like. The shielding enclosure 30 is positioned over the frame 10. The flanges 34 of the shielding enclosure 30 are placed around the side walls 14 of the frame 10. The protrusions 342 are received in the holes 122. The barrel portion 36 is disposed between the two hinged portions 142. The shaft 50 extends through the hinged portions 142 and the barrel portion 36. Accordingly, the shielding enclosure 30 is rotatably connected to the frame 10. When the components shielded in the shielding device 100 need to be replaced, repaired or otherwise adjusted, the shielding enclosure 70 can easily be opened.

It is to be understood that the through hole 122 may be formed on the shielding enclosure 30 and the protrusions 342 is located on the frame 10.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A shielding device comprising:
   a frame comprising a plurality of sidewalls and a top wall, the side walls extending downwardly from the top wall, the top wall including fringes, one of the fringes defining a notch with a first edge and two opposite second edges, at least one coiled hinged portion extending along the first edge in the notch, a gap defined between the at least one hinged portion and each of the second edges of the top wall; and
   a shielding enclosure comprising a cover and a plurality of flanges extending therefrom for engagement with the sidewalls of the frame, the cover including a bare edge without the flanges, a coiled barrel portion formed on the bare edge of the cover and aligned with the at least one hinged portion;
   a shaft extending through the at least one hinged portion and the barrel portion for rotatably connecting the shielding enclosure to the frame.

2. The shielding device as claimed in claim 1, wherein the frame and the shielding enclosure are formed from stamped metal.

3. The shielding device as claimed in claim 1, wherein each side wall of the frame defines at least one hole, each flange forms at least one protrusion being received in the at least one hole.

4. The shielding device as claimed in claim 1, where the number of the hinged portion is two, the barrel portion disposed between the two hinged portions.

5. A device for providing radio frequency shielding, comprising:
   a frame configured to extend around the periphery of an electronic component, the frame comprising sidewalls and a top wall, the side walls extending downwardly from the top wall, the top wall including fringes, one of the fringes defining a notch with a first edge and two second edges, two coiled hinged portions extending along the first edge in the notch, a gap defined between each hinged portion and adjacent one second edge of the top wall;
   a shielding enclosure rotatably attached to the frame by the shaft, the shielding enclosure comprising a cover and a plurality of flanges extending therefrom for engagement with the sidewalls of the frame, the cover including a bare edge without the flanges, a coiled barrel portion formed on the bare edge of the cover; and
   a shaft extending through the hinged portions and the barrel portion for rotatably connecting the shielding enclosure to the frame.

6. The device for providing radio frequency shielding as claimed in claim 5, wherein the flanges of the shielding enclosure depend from the cover at an angle of at least approximately 90 degrees relative to the cover.

* * * * *